(12) United States Patent
Jacob et al.

(10) Patent No.: US 12,254,913 B2
(45) Date of Patent: Mar. 18, 2025

(54) NON-VOLATILE ELECTRO-OPTICAL HIGH-BANDWIDTH ULTRA-FAST LARGE-SCALE MEMORY ARCHITECTURE

(71) Applicant: UNIVERSITY OF SOUTHERN CALIFORNIA, Los Angeles, CA (US)

(72) Inventors: Ajey Jacob, Los Angeles, CA (US); Akhilesh Jaiswal, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 58 days.

(21) Appl. No.: 18/030,380

(22) PCT Filed: Oct. 5, 2021

(86) PCT No.: PCT/US2021/053586
§ 371 (c)(1),
(2) Date: Apr. 5, 2023

(87) PCT Pub. No.: WO2022/076423
PCT Pub. Date: Apr. 14, 2022

(65) Prior Publication Data
US 2024/0021231 A1    Jan. 18, 2024

Related U.S. Application Data

(60) Provisional application No. 63/087,603, filed on Oct. 5, 2020.

(51) Int. Cl.
*G11C 16/04* (2006.01)
*G11C 11/16* (2006.01)
(Continued)

(52) U.S. Cl.
CPC ........ *G11C 11/1673* (2013.01); *G11C 11/161* (2013.01); *G11C 11/1659* (2013.01);
(Continued)

(58) Field of Classification Search
CPC .............. G11C 11/1673; G11C 11/161; G11C 11/1659; G11C 11/1675; G11C 11/1697
See application file for complete search history.

(56) References Cited

U.S. PATENT DOCUMENTS 5,179,539 A * 1/1993 Horiguchi ........... G11C 11/4074
                                                  327/537
6,587,408 B1 * 7/2003 Jacobson ............... G11B 5/743
(Continued)

FOREIGN PATENT DOCUMENTS

WO        2015072856 A2    5/2015

OTHER PUBLICATIONS

International Search Report and Written Opinion daed Dec. 28, 2021 for PCT Appn. No. PCT/US21/53586, 10 pgs.
(Continued)

*Primary Examiner* — Pho M Luu
(74) *Attorney, Agent, or Firm* — Brooks Kushman P.C.

(57) ABSTRACT

An ultrafast non-volatile memory cell for wafer-scale integration includes a voltage divider that outputs an output voltage. The voltage divider includes a reference resistive
(Continued)

device that is a reference magnetic tunnel junction or another reference resistive component and a switchable magnetic tunnel junction that includes a free magnet and a fixed magnet. The switchable magnetic tunnel junction configured such that the free magnet is light switchable between a high impedance state and a low impedance state upon application of an electric signal and incident light. A transistor switch is configured to activate the voltage divider for memory write and read operations. A light modulator is in electrical communication with the output voltage from the voltage divider. The light modulator is configured to modulate a guided light beam for memory read operations. Arrays of the memory cells are also provided.

44 Claims, 16 Drawing Sheets

(51) Int. Cl.
  *H10B 61/00* (2023.01)
  *H10N 50/10* (2023.01)
(52) U.S. Cl.
  CPC ...... *G11C 11/1675* (2013.01); *G11C 11/1697* (2013.01); *H10B 61/22* (2023.02); *H10N 50/10* (2023.02)

(56) References Cited

U.S. PATENT DOCUMENTS

| | | |
|---|---|---|
| 2013/0311717 A1 | 11/2013 | Kim et al. |
| 2014/0017870 A1* | 1/2014 | Cai ............... H01L 29/66825 438/302 |
| 2016/0078914 A1 | 3/2016 | DeBrosse |
| 2018/0205004 A1 | 7/2018 | Park et al. |

OTHER PUBLICATIONS

Al Azim, Z et al., "Laser Induced Magnetization Reversal for Detection in Optical Interconnects," IEEE Electronc Device Letters, IEEE, USA, v. 35, n. 12 (2014), pp. 1317-1319.

Farkhani, H. et al., "LAS-NCS: A Laser-Assisted Spintronic Neuromorphic Computing System," IEEE Transactions on Circuits and Systems-II: Express Briefs, v. 66, n. 5 (2019), pp. 838-842.

Funabashi, N. et al., "Voltage-Controlled Magnetic Anisotropy in Tb-Fe-Co/MgO/Gd-Fe MTJ Devices," IEEE Transactions on Magnetics, v. 53, n. 11 (2017), 4 pgs.

Kimel, A. et al., "Writing magnetic memory with ultrashort light pulses," Nature Reviews Materials, v. 4, No. 3 (2019), 12 pgs.

Moradi, F., et al., "Spin-Orbit-Torque-based Devices, Circuits and Architectures," arxiv.org, Cornell Univ. Library, Ithaca, NY (2019), 17 pgs.

Extended European Search Report dtd Sep. 23, 2024 for EP Appn. No. 21878369.3, 14 pgs.

* cited by examiner

Electro Absoprtion Modulator

NON-VOLATILE ELECTRO-OPTICAL HIGH-BANDWIDTH ULTRA-FAST LARGE-SCALE MEMORY ARCHITECTURE

CROSS-REFERENCE TO RELATED APPLICATIONS

This application is the U.S. national phase of PCT Appln. No. PCT/US2021/053586 filed Oct. 5, 2021, which claims the benefit of U.S. provisional application Ser. No. 63/087,603 filed Oct. 5, 2020, the disclosures of which are hereby incorporated in their entirety by reference herein.

TECHNICAL FIELD

In at least one aspect, a novel non-volatile electro-optical high-bandwidth ultra-fast large-scale memory architecture is provided.

BACKGROUND

Three fundamental bottlenecks that render state-of-the-art computing platforms conspicuously inefficient for serving the needs of emerging data-intensive applications like AI (AI compute requirements are doubling every 3.5 months!) are 1) limited on-chip data storage with constrained bandwidth 2) off-chip data communication overhead 3) segregation of computing and memory owing to the von-Neumann architecture.

Accordingly, there is a need for improved memory architectures that address these bottle necks.

SUMMARY

In at least one aspect, the present invention solves one or more problems of the prior art by providing a wafer-scale optical ultra-fast memory chip. The optical read/write mechanism and the optical interconnects coupled with wafer-scale integration, provides memory storage density and speed beyond the reach of today's memory technology and computing platforms. It is also amenable to both on-demand configurable digital and analog acceleration. Although high-speed optical write for magnetic devices has been explored, a manufacturable pathway to enable a scalable array architecture that can read and write in a memory-like configuration has remained elusive.

In another aspect, the memory chip is a CMOS compatible ultra-fast, high-density, high bandwidth non-volatile memory for data-intensive computing applications such as Artificial Intelligence (including both training and inference), encryption, and the like.

In another aspect, the magnetic memory chip optical read/write and the optical interconnects are faster with higher bandwidth and inherently advantageous for wafer-scale integration. This is in contrast to electrical read/write memory and electrical interconnects that are slow, and bandwidth limited.

In another aspect, an ultrafast non-volatile memory cell for wafer-scale integration is provided. The ultrafast non-volatile memory cell includes a voltage divider that outputs an output voltage. The voltage divider includes a reference resistive device that is a reference magnetic tunnel junction or another reference resistive component and a switchable magnetic tunnel junction that includes a free magnet and a fixed magnet. The reference resistive device and the switchable magnetic tunnel junction are arranged in series. The switchable magnetic tunnel junction is configured such that the free magnet is light switchable between a high impedance state and a low impedance state upon application of an electric signal and incident light. A switching component is configured to activate the voltage divider for memory read and write operations, the switching component being in series with the voltage divider. A light modulator in electrical communication with the output voltage is configured to modulate a guided light beam for memory read operations.

In another aspect, the switching component includes an electronically activated transistor.

In another aspect, the switching component includes a photodiode or phototransistor.

In another aspect, a memory array that includes a plurality of memory cells arranged with rows of memory cells and columns of memory cells is provided. Each memory cell includes a voltage divider that outputs an output voltage. The voltage divider includes a reference resistive device that is a reference magnetic tunnel junction or another reference resistive component; and a switchable magnetic tunnel junction that includes a free magnet and a fixed magnet. The reference resistive device and the switchable magnetic tunnel junction are arranged in series. The switchable magnetic tunnel junction is configured such that the free magnet is light switchable between a high impedance state and a low impedance state upon application of an electric signal and incident light. A switching component is configured to activate the voltage divider for memory write operations. The switching component is in series with the voltage divider. An applied voltage can be applied across the combination of the voltage divider and the switching component. Aa light modulator is in electrical communication with the output voltage and is configured to modulate a guided light beam for memory write operations.

In another aspect, a memory array includes an array of memory components arranged in rows of memory cells and columns of memory cells. Each column includes a reference resistive device; and a plurality of memory cell components. Each memory cell component includes a switchable magnetic tunnel junction that includes a free magnet and a fixed magnet. The reference resistive device and the switchable magnetic tunnel junction are arranged in series. The switchable magnetic tunnel junction is configured such that the free magnet is light switchable between a high impedance state and a low impedance state upon application of an electric signal and incident light. Characteristically, the reference resistive device and a selected switchable magnetic tunnel junction form a voltage divider that provides an output voltage. A switching component is configured to activate the voltage divider for memory read and write operations. The switching component is in series with the voltage divider. A light modulator is in electrical communication with the output voltage and is configured to modulate guided light for memory read operations. Advantageously, each switching component of each row of memory cell components is in electrical communication with the same control signal so that a row of memory cell components can be simultaneously selected.

In another aspect, a wafer having wafer scale memory integration of the memory array set forth herein is provided. The memory arrays and/or memory structures and/or optical interconnects can be printed or deposited on the wafer.

In another aspect, an ultrafast non-volatile memory cell for wafer-scale integration is provided. The ultrafast non-volatile memory cell includes a voltage divider that outputs an output voltage. The voltage divider includes a reference resistive device that is a reference magnetic tunnel junction or another reference resistive component and a switchable SOT device. The switchable SOT device includes a free magnet and a fixed magnet which are disposed over an SOT layer. The SOT layer has a first SOT terminal and a second SOT terminal. The reference resistive device and the switchable SOT device are arranged in series. Characteristically, the switchable SOT device is configured such that the free magnet is light switchable between a high impedance state and a low impedance state upon application of an electric signal and incident light. A first transistor switch is in electrical communication with the first SOT terminal. The first transistor switch has a first junction end and a second junction end, the second junction end being in direct electrical communication with the first SOT terminal. A second transistor switch is in electrical communication with the reference resistive device. The second transistor switch has a third junction end and a fourth junction end. The third junction end is in direct electrical communication with the reference resistive device that. A light modulator is in electrical communication with the output voltage and configured to modulate a guided light beam for memory write operations.

In another aspect, light of different wavelengths is applied to optical interconnects in different columns of memory cells or memory cell components in the memory arrays set forth herein.

In another aspect, method of in-memory computing uses the memory arrays set forth herein. The method includes a step of simultaneously activating rows of memory cells or memory components.

In still another aspect, the memory architecture can either be configured for classical digital computing or for unconventional analog computing as well as neuromorphic computing. Advantageously, the memory architecture provides:
(1) wafer-scale single super chip integration
(2) ultra-low leakage non-volatile magnetic memory architecture;
(3) optical read and write capability;
(4) passive and active silicon and Silicon Nitride photonics interconnects for long-distance wafer-scale communication;
(6) variation to thermal tolerance because of the athermal photonics and non-volatile magnetic memory system; and
(7) on-demand configurable digital and analog computing.

Some aspects are based on combining an optically switched voltage-controlled magnetic tunnel junction (MTJ) with silicon photonics components such as an optical ring modulator or electro-absorption modulator to enable very fast memory access time. The memory design lends itself readily for wafer-scale integration, thereby paving the way for the largest and fastest memory system with the added benefit of non-volatility. Moreover, the memory design does not require the precise steering of a laser pulse to write data into optical MTJs. Further, the presented memory architecture can support both high accuracy digital computing and accelerated approximate analog computing. The memory design can target data-intensive applications that require high memory bandwidth and speed. These include AI acceleration with both training and inference, neuromorphic computing, encryption, etc. The memory system can be envisioned as a server-based system to be accessed by remote clients.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

For a further understanding of the nature, objects, and advantages of the present disclosure, reference should be had to the following detailed description, read in conjunction with the following drawings, wherein like reference numerals denote like elements and wherein.

DETAILED DESCRIPTION

Figure 1A:
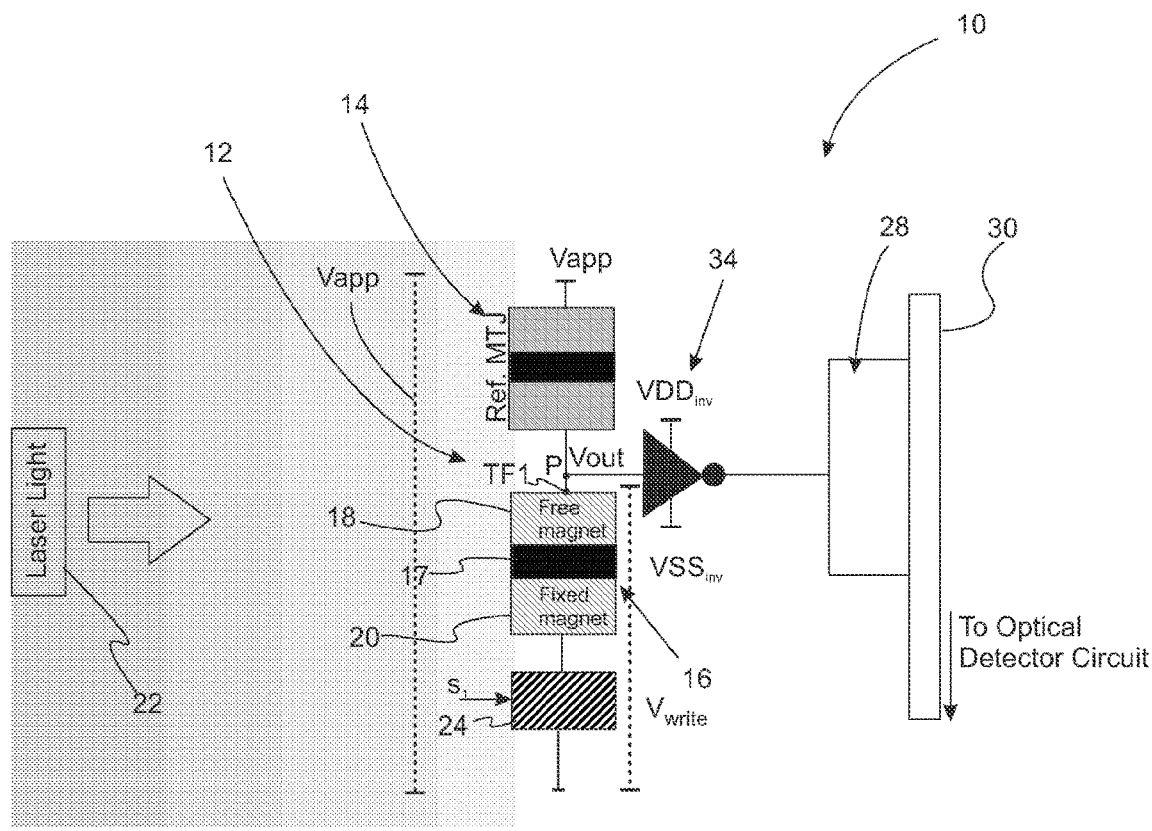
FIG. 1A. Schematic of a memory cell using magnetic tunnel junctions.
Figure 1A:
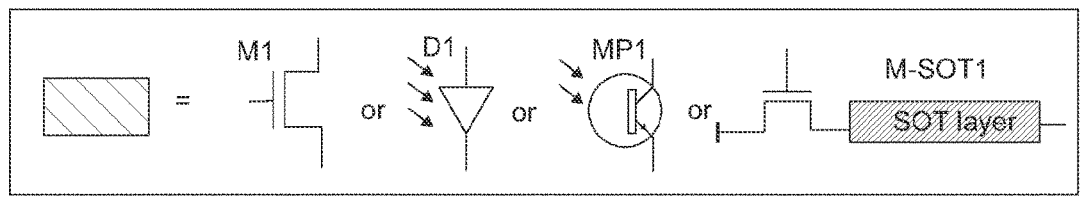

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1 to 2.1 the following numbers 1.2, 1.3, 1.4, 1.5, 1.6, 1.7, 1.8, 1.9, and 2.0 can be selected as lower or upper limits.

The phrase "composed of" means "including," "comprising," or "consisting of." Typically, this phrase is used to denote that an object is formed from a material.

The term "connected to" means that the electrical components referred to as connected to are in electrical communication. In a refinement, "connected to" means that the electrical components referred to as connected to are directly wired to each other. In another refinement, "connected to" means that the electrical components communicate wirelessly or by a combination of wired and wirelessly connected components. In another refinement, "connected to" means that one or more additional electrical components are interposed between the electrical components referred to as connected to with an electrical signal from an originating component being processed (e.g., filtered, amplified, modulated, rectified, attenuated, summed, subtracted, etc.) before being received to the component connected thereto.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

The term "directly connected to" or "in direct electrical communication: means that at terminal or end of a given electronic device is closer to another device than another terminal or end in the given electronic device.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The term "electrical signal" or "signal" refers to the electrical output from an electronic device or the electrical input to an electronic device. The electrical signal is characterized by voltage and/or current. The electrical signal can be stationary with respect to time (e.g., a DC signal) or it can vary with respect to time.

The term "electronic component" refers is any physical entity in an electronic device or system used to affect electron states, electron flow, or the electric fields associated with the electrons. Examples of electronic components include, but are not limited to, capacitors, inductors, resistors, thyristors, diodes, transistors, etc. Electronic components can be passive or active.

The term "electronic device" or "system" refers to a physical entity formed from one or more electronic components to perform a predetermined function on an electrical signal.

The term "junction end" refers to the source or drain of a field-effect transistor.

The term "ON" means that a transistor is actuated so current will flow between the source and drain. An appropriate turn ON control signal on the gate turns a transistor switch ON.

The term "OFF" means that a transistor is actuated so current will flow between the source and drain. An appropriate turn OFF control signal on the gate turns a transistor switch OFF.

It should be appreciated that in any figures for electronic devices, a series of electronic components connected by lines (e.g., wires) indicates that such electronic components are in electrical communication with each other. Moreover, when lines directed connect one electronic component to another, these electronic components can be connected to each other as defined above.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

Throughout this application, where publications are referenced, the disclosures of these publications in their entireties are hereby incorporated by reference into this application to more fully describe the state of the art to which this invention pertains.

Abbreviations

"EAM" means electro-absorption modulator.
"MTJ" means magnetic tunnel junction.

"Poly resistor" means poly-silicon resistor.
"SOT" means spin-orbit torque.
"STT" means spin-transfer torque.
"WDM" means wavelength Division Multiplexing.

Component Item Numbers

10, $10^k$, $10^{ik}$: memory cell where i is an integer label for rows, and k is an integer label for rows.
12, $12^{ik}$: voltage divider where i is an integer label for rows, and k is an integer label for rows.
14, $14^k$, $14^{ik}$: reference resistive component where i is an integer label for rows, and k is an integer label for rows.
16, $16^k$, $16^{ik}$: switchable magnetic tunnel junction where i is an integer label for rows, and k is an integer label for rows.
18, 48: free magnet.
20, 50: fixed magnet.
22: laser.
24, $24^k$, $24^{ik}$: switching component where i is an integer label for rows, and k is an integer label for rows.
28, $28^k$, $28^{ik}$: light modulator where i is an integer label for rows, and k is an integer label for rows.
30, $30^k$, $30^{ik}$: guided light beam where i is an integer label for rows, and k is an integer label for rows.
34, $34^k$, $34^{ik}$: modifying circuit or device where i is an integer label for rows, and k is an integer label for rows.
46: SOT device.
60, 64, 66, 70, 80: memory array.
52: SOT layer.
I11, I12, and I13: voltage lines.
ST1, ST2: SOT terminals.
TJ1, TJ2, TJ3, TJ4: transistor junction ends.
TF1: free magnet terminal.

With reference to FIG. 1A, a schematic of an ultrafast non-volatile memory cell for wafer-scale integration is provided. Memory cell 10 includes a voltage divider 12 that outputs an output voltage Vout. The voltage divider 12 includes reference resistive component 14 and switchable magnetic tunnel junction 16. Reference resistive component 14 provides a substantially fixed reference voltage for voltage divider 12. In a refinement, reference resistive component 14 is a reference magnetic tunnel junction (e.g., two ferromagnets with an insulating layer interposed in between) or another type of resistive element (e.g., a poly resistor or other resistor). Memory cell 10 includes a switchable magnetic tunnel junction 16 that includes a free magnet 18 and a fixed magnet 20. In a refinement, an electrically insulating layer 17 (e.g., a dielectric) is interposed between free magnet 18 and fixed magnet 20. Examples of switchable magnetic tunnel junctions include voltage controlled magnetic tunnel junctions, spin transfer torque devices, and combinations thereof. In many applications, switchable magnetic tunnel junction 16 is a voltage controlled magnetic tunnel junction.

Reference resistive device 14 and the switchable magnetic tunnel junction 16 are arranged in series such that the voltage output is provided from a point P between the reference resistive component 14 and the switchable magnetic tunnel junction 16. Switchable magnetic tunnel junction 16 is configured such that the free magnet 18 is light switchable between a high impedance (e.g., high resistance) state and a low impedance (e.g., low resistance) state upon application of an electric signal and incident light. The electric signal can be a voltage signal (e.g., 0.5 V to 3 V) or current signal. Typically, the high impedance state results in a higher value for the output voltage Vout than the low impedance state. The terms "high" and "low" are relative to each other. In a refinement, the magnetic tunnel junction and the switchable magnetic tunnel junction 16 utilize perpendicular magnetization. In another refinement, the magnetic tunnel junction 14 and the switchable magnetic tunnel junction 16 utilize in-plane magnetization. Typically, this switching is accomplished with a laser 22. Switching component 24 is configured to activate the voltage divider 12. Switching component 24 is in series with the voltage divider 12. Switching component 24 is in series with the voltage divider. The use of light for both writing and reading operations allows for the wafer scale integration. In contrast, electrical interconnects are not good for long distance connections. Switching component 24 can be an electrically actuated transistor M1, a photodiode D1, a phototransistor MP1, and a transistor SOT layer combination MSOT1. Variations of the memory cell of FIG. 1A are provided in FIGS. 1B, 1C, and 1D with different switching components are set forth below.

Still referring to FIG. 1A, light modulator 28 is in electrical communication with the output voltage. Light modulator 28 is configured to modulate a guided light beam 30 for memory read operations.

In a variation of the memory cells of FIG. 1A, a signal modifying circuit 34 is interposed between the voltage divider 12 and the light modulator. In a refinement, signal modifying circuit 34 is an inverter. In another refinement, signal modifying circuit 34 is an amplifier.

Still referring to FIG. 1A memory write operations are performed by applying an appropriate write voltage Vwrite across the combination of the switchable magnetic tunnel junction 16 and the and switching component 24 and then directing incident light on the switchable magnetic tunnel junction such that neighboring magnetic tunnel junctions do not have appropriate applied voltage across thereon and therefore do not switch. The value and polarity of the write voltage Vwrite will depend of the value of the memory bit to be written (i.e., 1 or 0 valued bit).

Read operations are performed by applying a read voltage Vapp (e.g., 0.5 V to 3 V) across the combination of the voltage divider 12 and an actuating signal $s_1$ to the switching component 24 such that the voltage divider 12 provides the output voltage Vout. The actuating signal is an electrical signal (e.g., a voltage applied to the gate of a MOSFET) when switching component 24 is electronically actuator or light when switching component 24 is light activated. The read voltage Vapp results in a high voltage or low voltage depending on the state of the combination of the reference resistive device 14 and the switchable magnetic tunnel junction 16. The output voltage drives light modulator 28. It should be appreciated that the read voltage can have a lower, equal, higher or even of different polarity as compared to the write voltage. Characteristically, the light modulator 28 changes the phase, amplitude, or another property of the guided light beam in voltage dependent way that can be detected for memory read applications. Examples of light modulators include, but are not limited to optical ring modulator, an electro-absorption modulator, a Mach-Zehnder modulator, and the like.

Figure 1B:
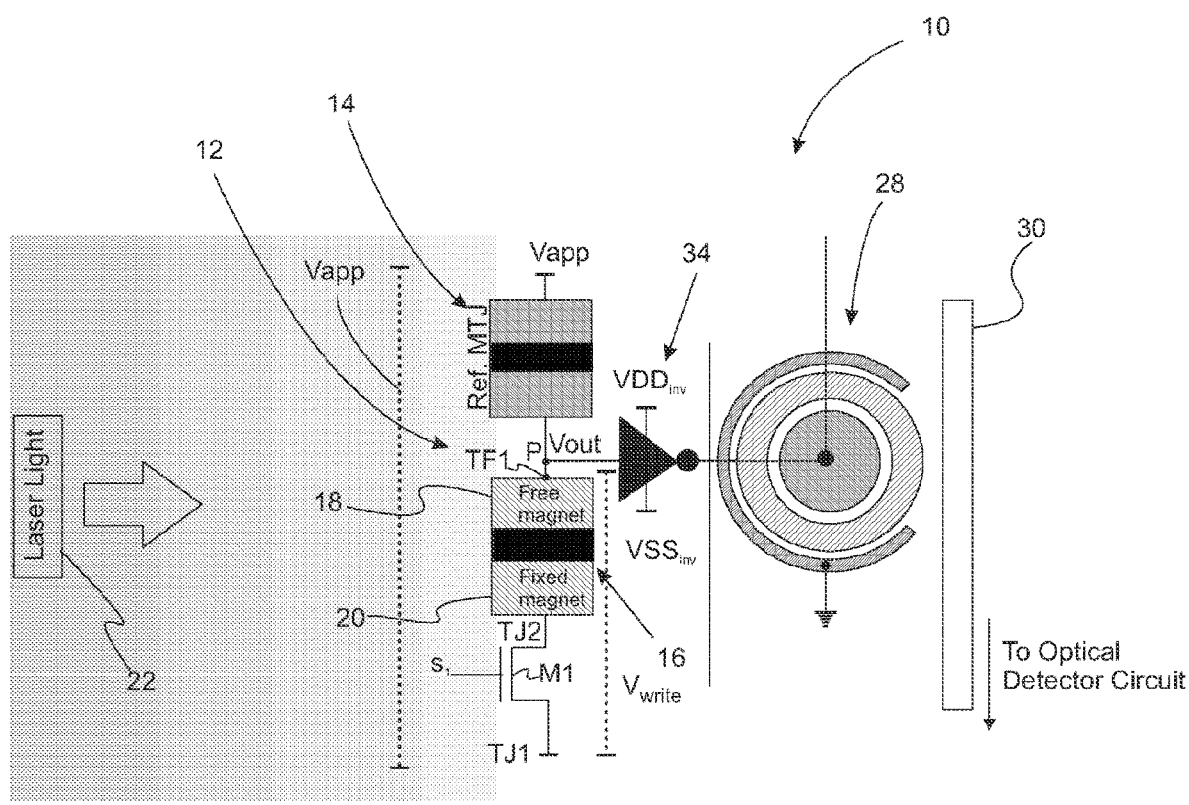
FIG. 1B. Schematic of a memory cell using magnetic tunnel junctions and an optical ring modulator.
Figure 1C:
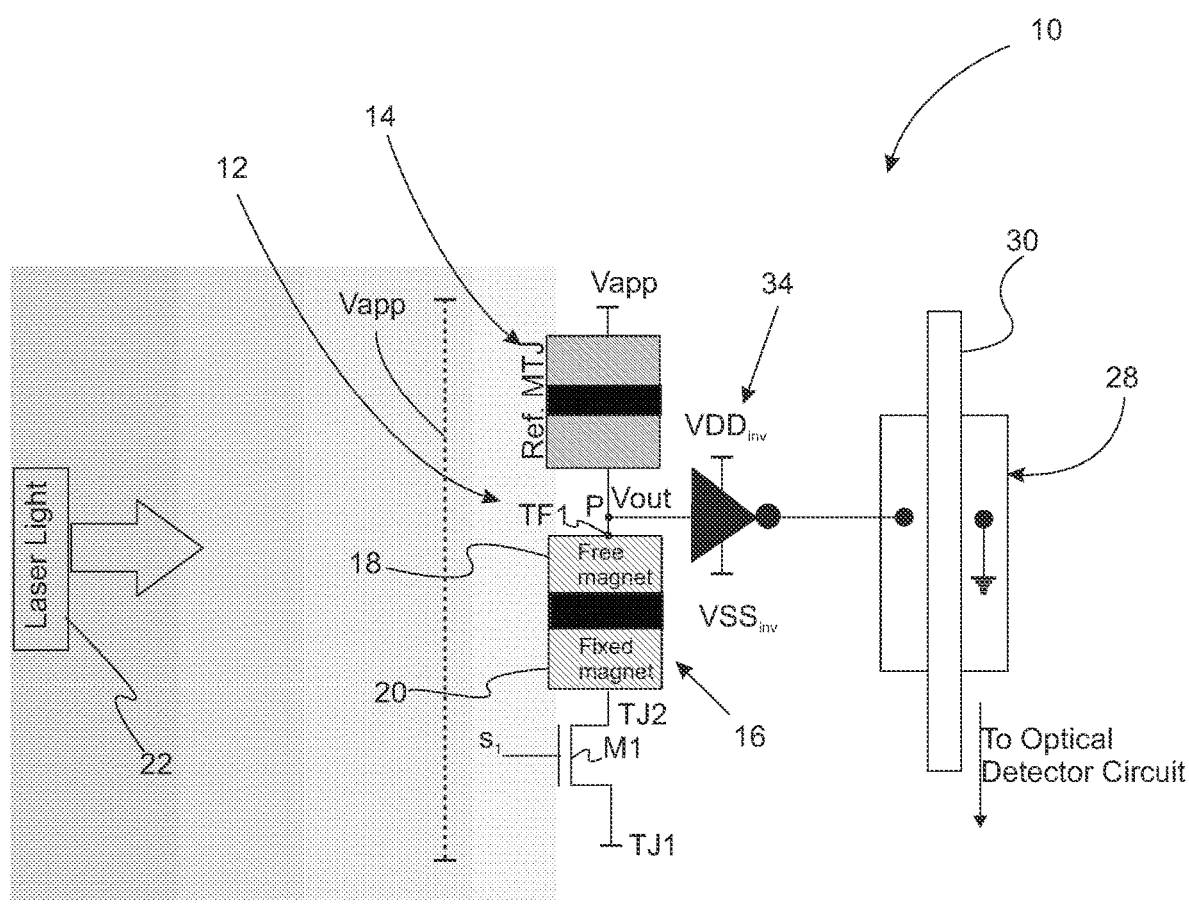
FIG. 1C. Schematic of a memory cell using magnetic tunnel junctions and an electro-absorption modulator.

With reference to FIGS. 1B and 1C, schematics of an ultrafast non-volatile memory cell for wafer-scale integration in which the switching component is electrically actuated (e.g., a transistor) are provided. As set forth above, memory cell 10 includes a voltage divider 12 that outputs an output voltage Vout. The voltage divider 12 includes reference resistive component 14 and switchable magnetic tunnel junction 16. Reference resistive component 14 provides a substantially fixed reference voltage for voltage divider 12.

In a refinement, reference resistive component 14 is a reference magnetic tunnel junction or another type of resistive element (e.g., a poly resistor). Memory cell 10 includes a switchable magnetic tunnel junction 16 that includes a free magnet 18 and a fixed magnet 20. Examples of switchable magnetic tunnel junctions include voltage controlled magnetic tunnel junctions, spin transfer torque devices, and combinations thereof. In many applications, switchable magnetic tunnel junction 16 is a voltage controlled magnetic tunnel junction. As set forth above, reference resistive device 14 and the switchable magnetic tunnel junction 16 are arranged in series such that the voltage output is provided from a point P between the reference resistive component 14 and the switchable magnetic tunnel junction 16. Switchable magnetic tunnel junction 16 is configured such that the free magnet 18 is light switchable between a high impedance (e.g., high resistance) state and a low impedance (e.g., low resistance) state upon application of an electric signal and incident light. The electric signal can be a voltage signal or current signal. As set forth above, the high impedance state results in a higher value for the output voltage Vout than the low impedance state. The terms "high" and "low" are relative to each other. In a refinement, the magnetic tunnel junction and the switchable magnetic tunnel junction 16 utilize perpendicular magnetization. In another refinement, the magnetic tunnel junction and the switchable magnetic tunnel junction 16 utilize in-plane magnetization. Typically, this switching is accomplished with a laser 22. Switching component 24 is configured to activate the voltage divider 12. Switching component 24 is in series with the voltage divider 12 with transistor junction end TJ2 in direct electrical communication with the voltage fixed magnet. Switching component 24 is in series with the voltage divider. Light modulator 28 is in electrical communication with the output voltage. Light modulator 28 is configured to modulate a guided light beam 30 for memory read operations.

Figure 1D:
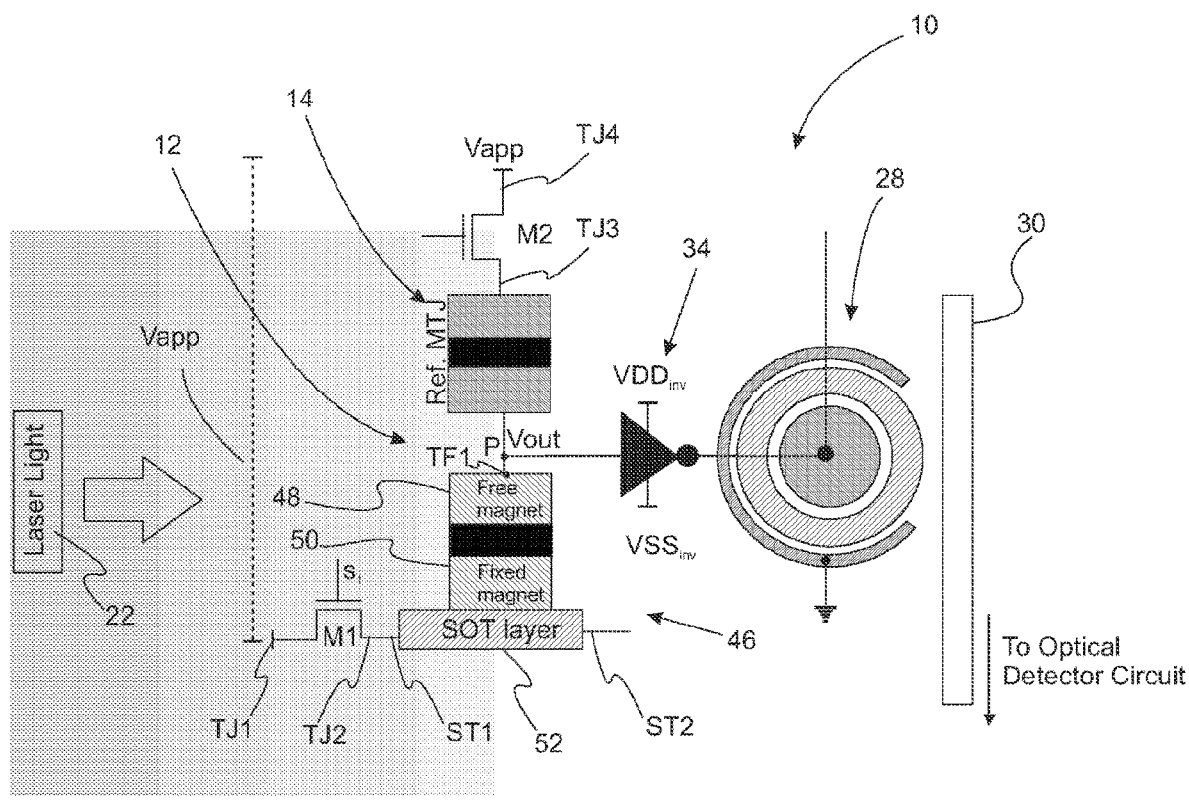
FIG. 1D. Schematic of a memory cell using an SOT and an optical ring modulator.
Figure 1E:
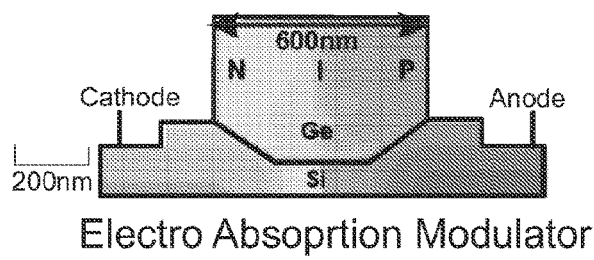
FIG. 1E. Schematic of an electro-absorption modulator.

With reference to FIG. 1D, schematics of an ultrafast non-volatile memory cell for wafer-scale integration are provided. This variation includes a SOT layer in electrical communication with a transistor. Memory cell 10 includes a voltage divider 12 that outputs an output voltage Vout. The voltage divider 12 includes reference resistive component 14 and switchable SOT device 46. Reference resistive component 14 provides a substantially fixed reference voltage for voltage divider 12. In a refinement, reference resistive component 14 is a reference magnetic tunnel junction or another type of resistive element (e.g., a poly resistor). Memory cell 10 includes a switchable SOT device 46 that includes a free magnet 48 and a fixed magnet 50 which are disposed over and typically contacts SOT layer 52. Typically, SOT layer 52 is composed of a heavy metal like Pt, Ta, tungsten, or by alloys of heavy metal. Magnets are usually CoFeB that may be doped with Gd.

Reference resistive device 14 and the switchable SOT device 46 are arranged in series such that the voltage output Vout is provided from a point P between the reference resistive component 14 and the switchable SOT device 46. Switchable SOT device 46 is configured such that the free magnet 48 is light switchable between a high impedance (e.g., high resistance) state and a low impedance (e.g., low resistance) state upon application of an electric signal and incident light. The electric signal can be a voltage signal or current signal. Typically, the high impedance state results in a higher value for the output voltage Vout than the low impedance state. The terms "high" and "low" are relative to each other. The use of light for both writing and reading operation allows for the wafer scale integration. In contrast, electrical interconnects are not good for long distance connections. Light modulator 28 is in electrical communication with the output voltage. Light modulator is configured to modulate a guided light beam for memory read operations.

Referring to FIG. 1D, read operations for memory cell 10 are similar to the read operation for memory cell 10 set forth above. Switch M1 is actuated by control signal s1. During write operation transistor switch M1 is ON such that a current flows between transistor junction end TJ1 and SOT terminal ST2. The direction of current flow depends on the data to be written. When light shines the current through SOT layer between transistor junction end TJ1 and SOT terminal ST2 light switches the free magnet. During the write operation M2 is OFF. M2 is ON only during read.

Referring to FIG. 1D, during read operations for memory cell 10, the second transistor M2 switch is ON while the first transistor switch M1 can be OFF thereby forming a voltage divider between the fourth junction end TJ4 and the second SOT terminal ST2 with Vapp (e.g., 0.5 V to 3 V) being applied thereto such that the light modulator in electrical communication with the output voltage Vout modulates the guided light beam 30 via light modulator 28.

In variations of the memory cells set forth above, modulate guided light beam 30 is directed to the light modulator with an optical interconnects (e.g., waveguides). In the variation depicted in FIGS. 1A and 1C, light modulator 28 is an optical ring modulator. In the variation depicted in FIG. 1B, light modulator 28 is an electro-absorption modulator. FIG. 1D provides a schematic of an absorption modulator. In a refinement, the optical interconnects includes optical waveguides, optical couplers, filters, polarizers, optical waveguide bends, optical waveguide tapers, beam splitters, beam combiners, and other optical components.

Advantageously, the combination of a voltage controlled MTJ with an optical ring modulator (RM) or electro-absorption modulator (EAM) combines non-volatility with fast access time. The inherent optical nature of write and read mechanism allows long-distance very-high-speed communication as necessary for wafer-scale integration.

It should be appreciated that the memory cell design of FIGS. 1A, 1B, 1C, and 1D provide high-speed write. As set forth above, the memory cells of FIGS. 1A, 1B, 1C, and 1D includes a voltage controlled MTJ with a free and fixed magnet, such that the free magnet can be switched by shining a laser pulse. Such laser-driven ultrafast (picosecond) switching of MTJs have been demonstrated in previous literature. A major bottleneck for using optical switching of MTJs for memory applications is the lack of write selectivity needed for building a memory array. Consider an MTJ array to be switched by optical laser pulses. For writing data in each bit, the laser beam has to be precisely controlled and steered such that it switches a specific MTJ without disturbing its neighbors. Such, on-chip steering of a laser beam at nano-scale precision is not achievable with today's technology. We circumvent this selective write issue by invoking voltage-controlled MTJs as opposed to the conventional current-controlled MTJs. The specific physics relied on is the Voltage Controlled Magnetic Anisotropy (VCMA), which is being heavily investigated, both from the industry and academia for energy-efficient MRAM as an alternative to the well-known spin-transfer torque (STT) MRAM. VCMA allows modulating (increase or decrease) the effective energy barrier to switch a magnet. As such, if a wide laser beam (without the need to precisely steer the beam over a single MTJ) is incident on an array of VCMA based MTJs, only those MTJs would switch with appropriate voltage to lower their switching energy-barrier owing to the VCMA mechanism. Other MTJs that experience laser light pulse but do not have a VCMA voltage across them would not switch. Note, the overall switching speed would be the sum of the time it takes to apply a voltage across the MTJ and optically switching the MTJ. Both these timescales can be in the picosecond regime (for a particular sub-array), thereby allowing very high-speed selective switching of magnetic memories. In comparison, the switching speed for the best electrical switching MTJs pursued by semiconductor industries are in the range of 5-10 ns and are limited by the physics of the electrical switching mechanism. The presented proposal supersedes the write speed for known optical (for example, optically switched PCMs could be in micro-second range) or even electrical silicon memories when very long interconnects as needed for wafer-scale integration is taken into account.

It should also be appreciated that the memory cell design of FIGS. 1A, 1B, 1C, and 1D provide high-speed read. To read the data in the MTJ, we form a voltage divider using the 'Data-MTJ' and a 'Ref-MTJ' as shown in FIG. 2. The output voltage from the inverter connected to the voltage divider node can act as the voltage input for an optical ring modulator (RM) or an input to an electro-absorption modulator (EAM). The input light is modulated by the output voltage from the inverter, which can be sensed to optically read the data stored in the MTJ over large distances.

In a variation of the memory cells of FIGS. 1A, 1B, 1C, and 1D, a signal modifying circuit 34 is interposed between the voltage divider 12 and the light modulator. In a refinement, signal modifying circuit 34 is an inverter. In another refinement, signal modifying circuit 34 is an amplifier.

In a variation, the memory cells of FIGS. 1A, 1B, 1C, and 1D can be used to form a memory array. Such arrays will include a plurality of memory cells of the design of FIG. 1A, 1B, or 1C. In some refinements, each column of memory cells share a common reference resistive device with the voltage divider.

Figure 2A:
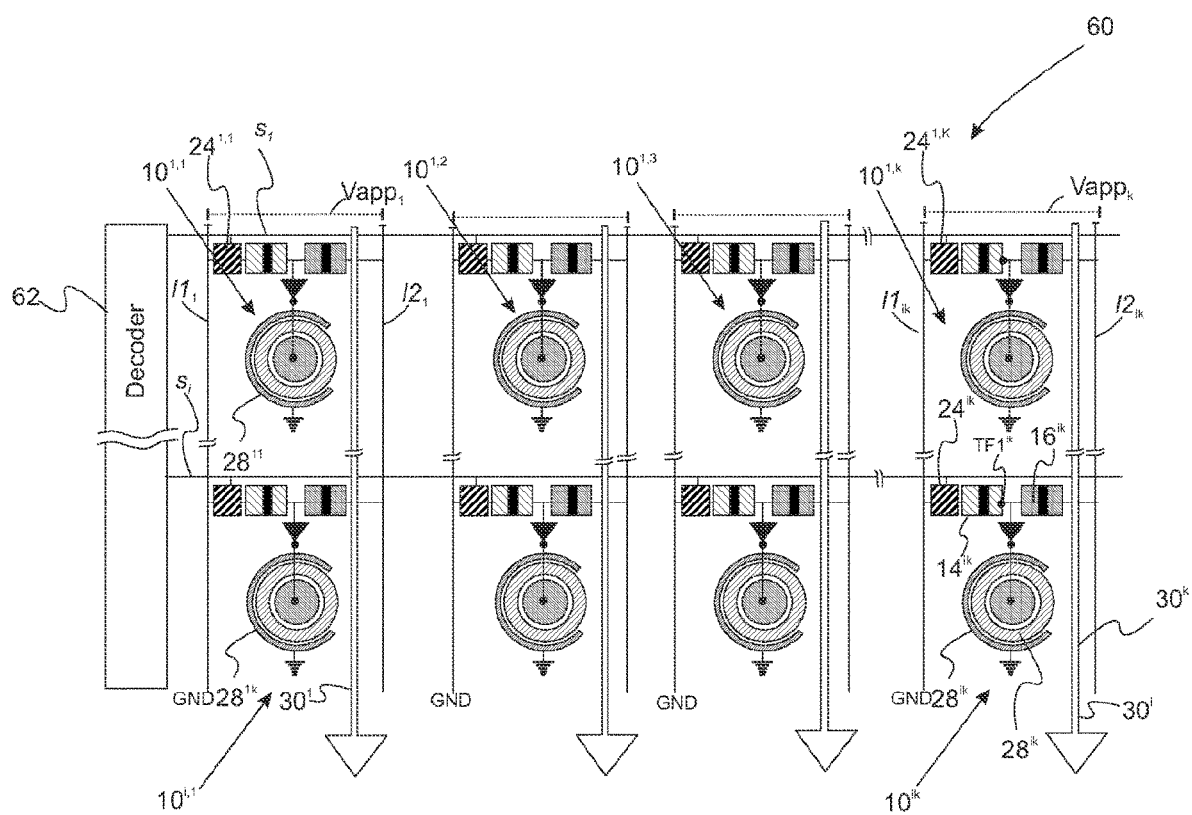
FIGS. 2A and 2B. Schematics of a memory cell array using memory cells of FIGS. 1A and 1B in which the optical modulator is an optical ring modulator.
Figure 2B:
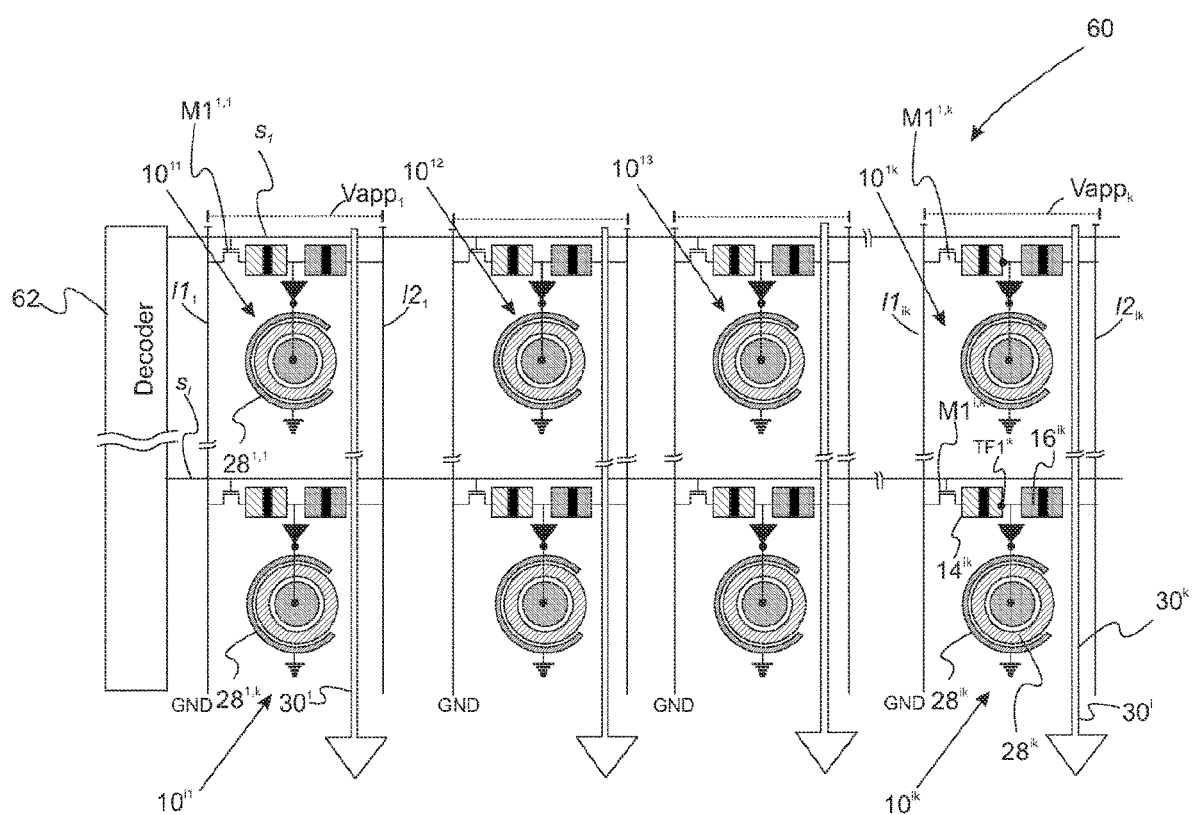

FIGS. 2A and 2B depicts memory arrays that include the memory cells of FIGS. 1A and 1B in which the light modulator is an optical ring modulator. Memory array 60 includes a plurality of memory cells $10^{i,k}$ are arranged with rows of memory cells and columns of memory cells where i is a label for the rows and k is a label for the columns. The switching component $24^{i,k}$ (of each row of memory cells is in electrical communication with the same control signal $s_i$. When switching component $24^{i,k}$ is electrically activated control signal is an electronic signal provided on electronic interconnects. When switching component $24^{i,k}$ (is light-activated control signal is a light signal $s_i$ typically provided by optical interconnects (e.g., waveguides). Therefore, a given row of memory cells is actuated (i.e., selected) by control signal $s_i$. Characteristically, each memory cell $10^{i,k}$ (in each column of the column of memory has the same applied voltage $Vapp_k$. In a refinement, memory array 60 further includes a decoder 62 that provides the control signals and allows selection of the rows of memory cells. The decoder can be an decode electrical signal or can be an optical decoder for optical (i.e., light) signals. Read/write operations are as described above. In this variation, optical modulator 28 is an optical ring modulator. FIG. 2B depicts an example in which switching component 24 is an electronically activated transistor $M1^{i,j}$. In a variation, a memory structure includes multiple array sections formed by the memory array of FIGS. 2A and/or 2B.

Figure 3A:
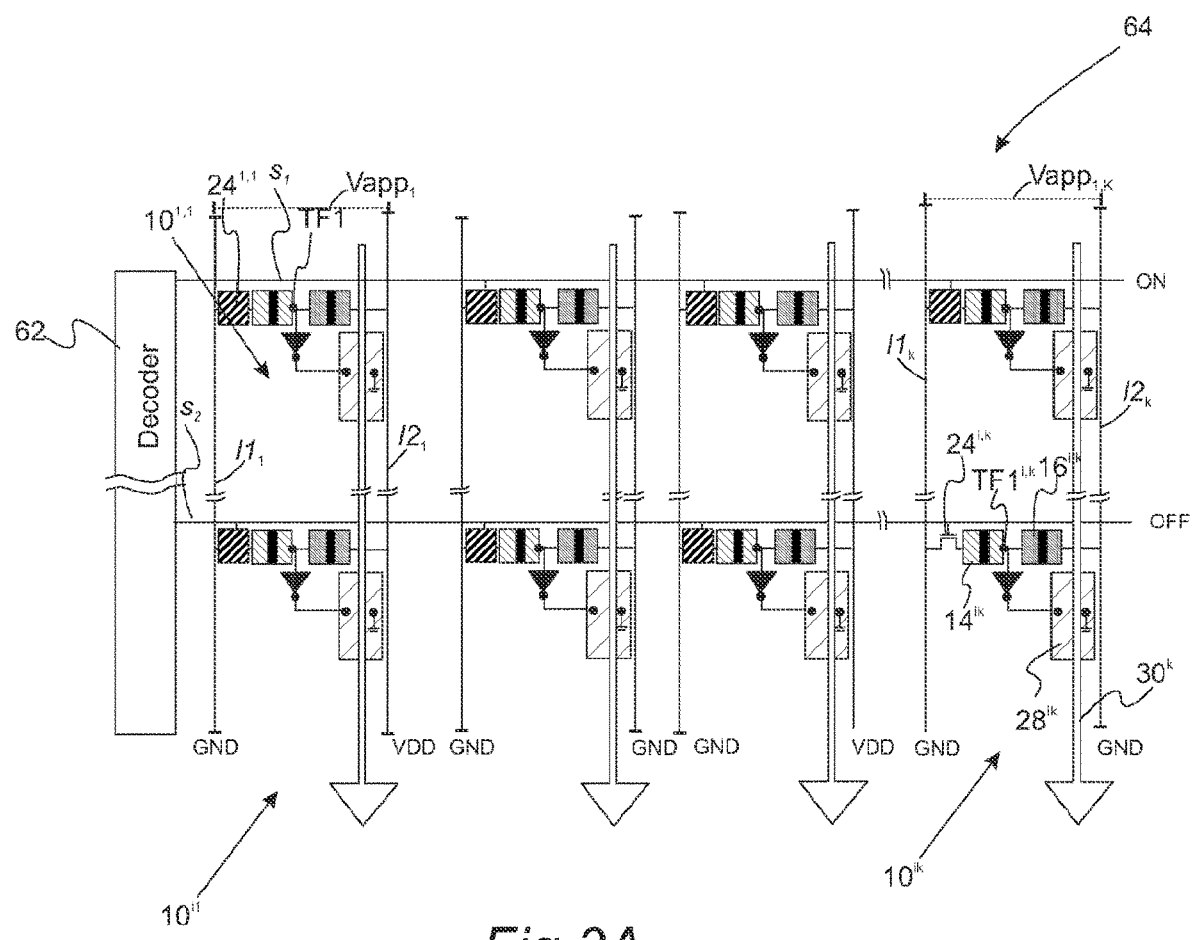
FIGS. 3A and 3B. Schematic of a memory cell arrays using memory cells of FIGS. 1A and 1C in which the optical modulator is an electro-absorption modulator.
Figure 3B:
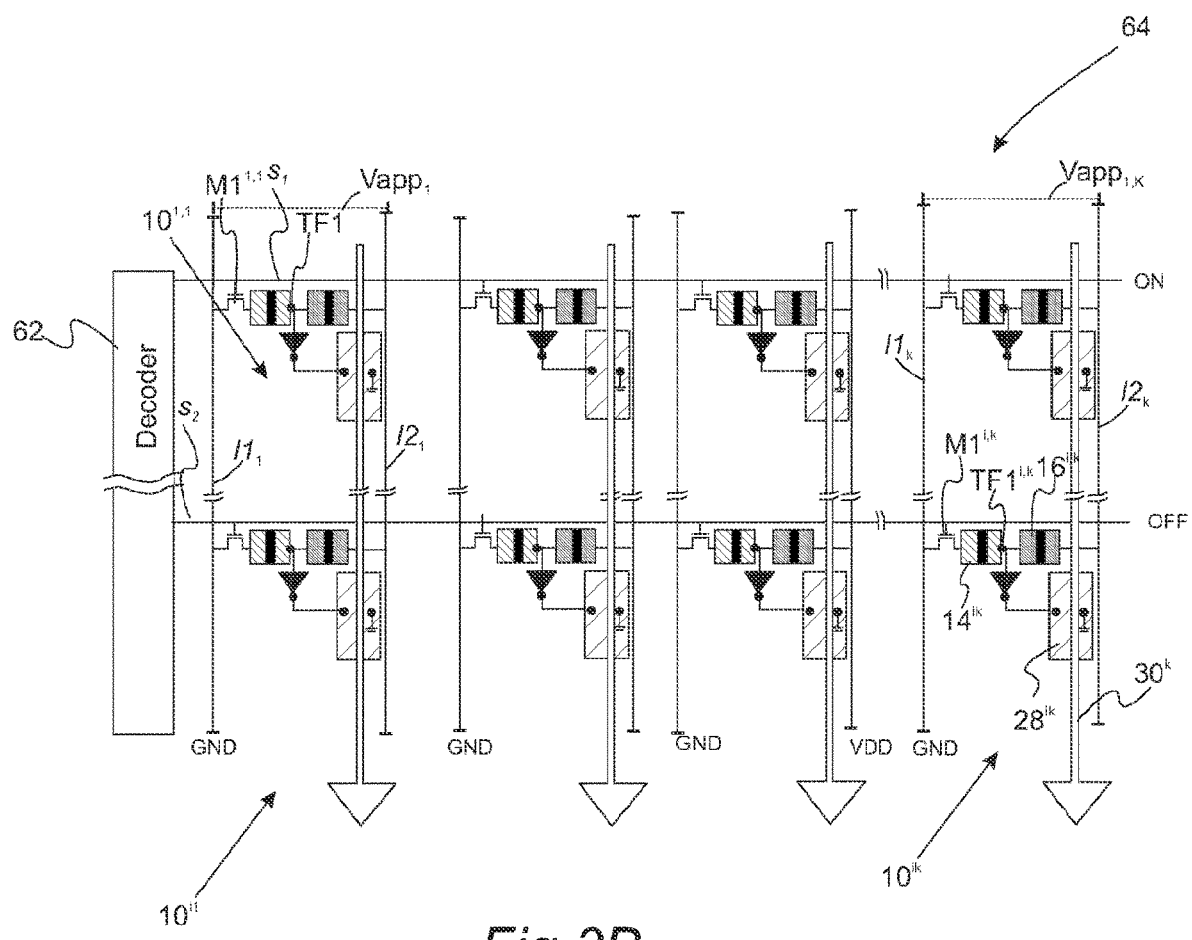

FIGS. 3A and 3B depicts memory arrays that include the memory cells of FIG. 1A in which the light modulator is an electro-absorption modulator. Memory array 64 includes a plurality of memory cells $10^{i,k}$ are arranged with rows of memory cells and columns of memory cells where i is a label for the rows and k is a label for the columns. The transistor switch of each row of memory cells is in electrical communication with the same control signal $s_i$. When switching component $24^{i,k}$ is electrically activated control signal is an electronic signal provided on electronic interconnects. When switching component $24^{i,k}$ (is light-activated control signal is a light signal $s_i$ typically provided by optical interconnects (e.g., waveguides). Therefore, a given row of memory cells is actuated (i.e., selected) by control signal $s_i$. Characteristically, each memory cell $10^{i,k}$ in each column of the column of memory has the same applied voltage $Vapp_k$. In a refinement, memory array 64 further includes a decoder 62 that provides the control signals and allows selection of the rows of memory cells. Read/write operations are as described above. In this variation, optical modulator 28 is an electro-absorption modulator. FIG. 3B depicts an example in which switching component 24 is an electronically activated transistor $M1^{i,j}$. In a variation, a memory structure includes multiple array sections formed by the memory array of FIGS. 3A and/or 3B.

Figure 4A:
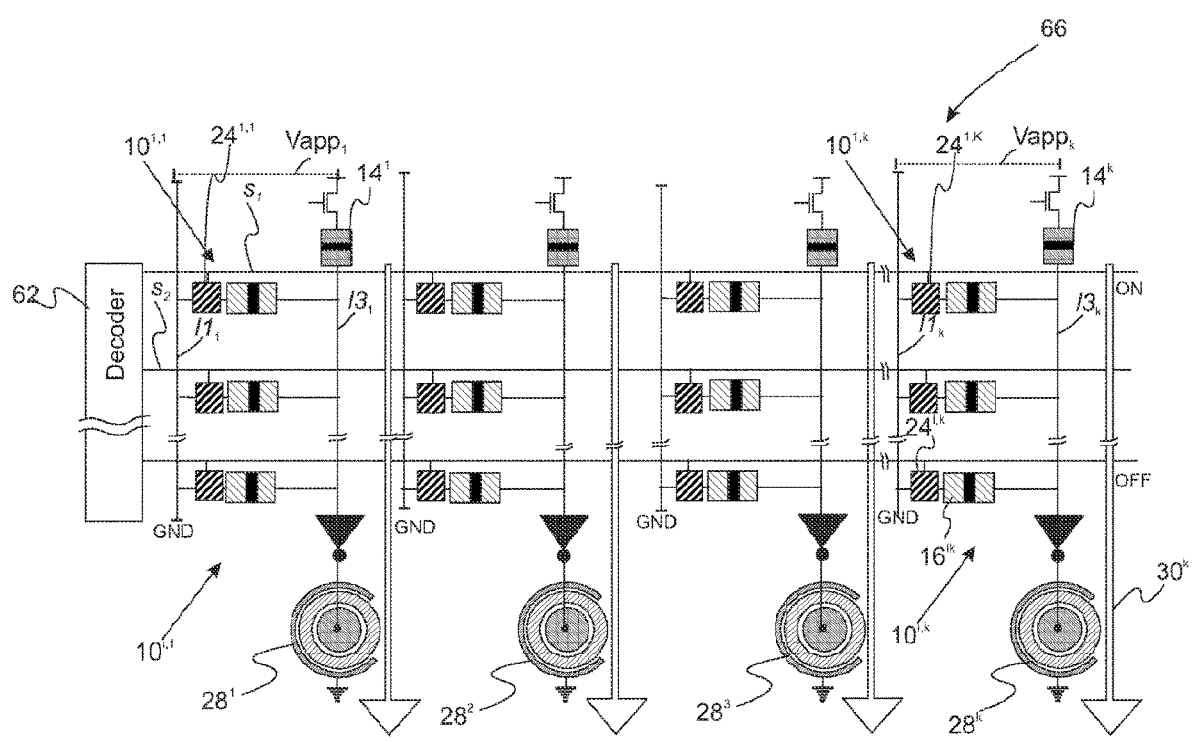
FIGS. 4A and 4B. Schematics of memory arrays in which columns of memory cells share a common reference resistive component and in which the optical modulator is an optical ring modulator.
Figure 4B:
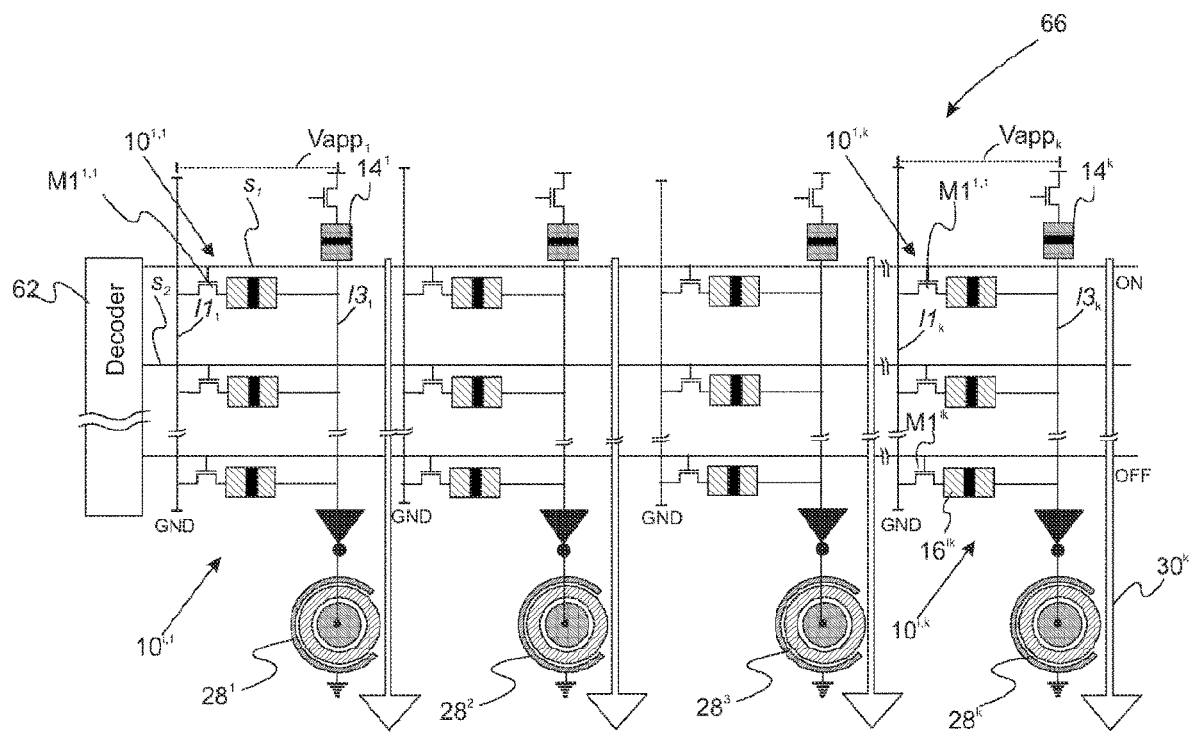
Figure 5A:
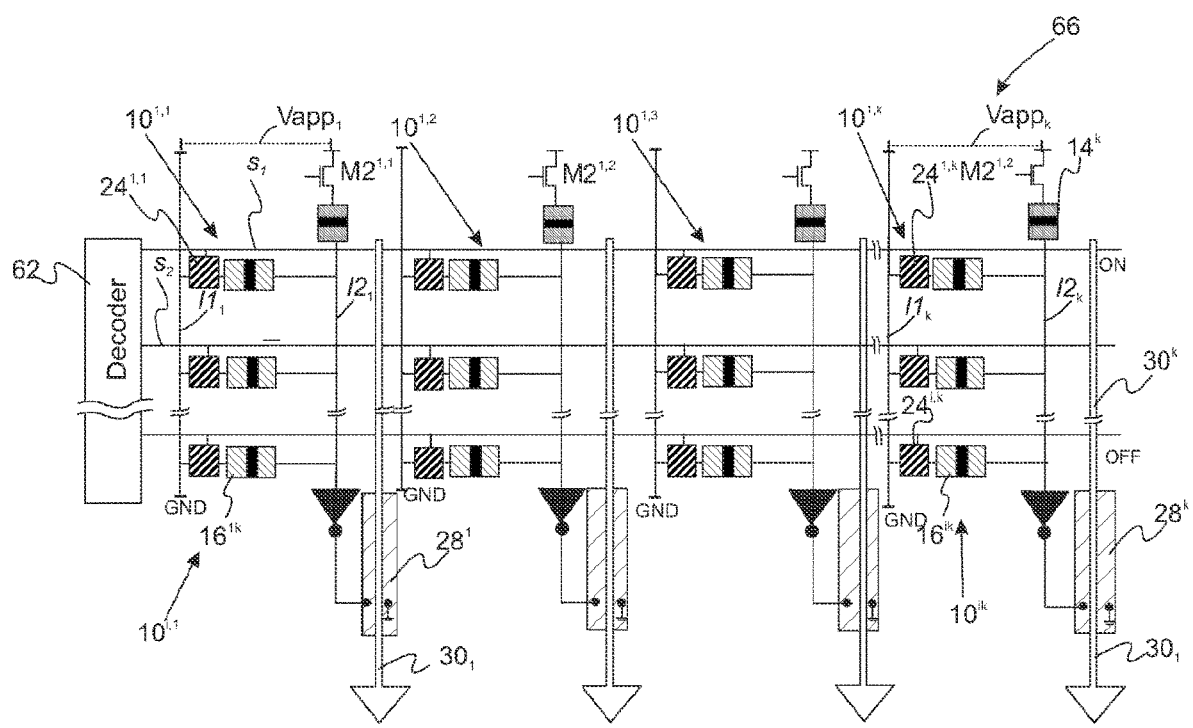
FIGS. 5A and 5B. Schematics of memory arrays in which columns of memory cells share a common reference resistive component and in which the optical modulator is an electro-absorption modulator.
Figure 5B:
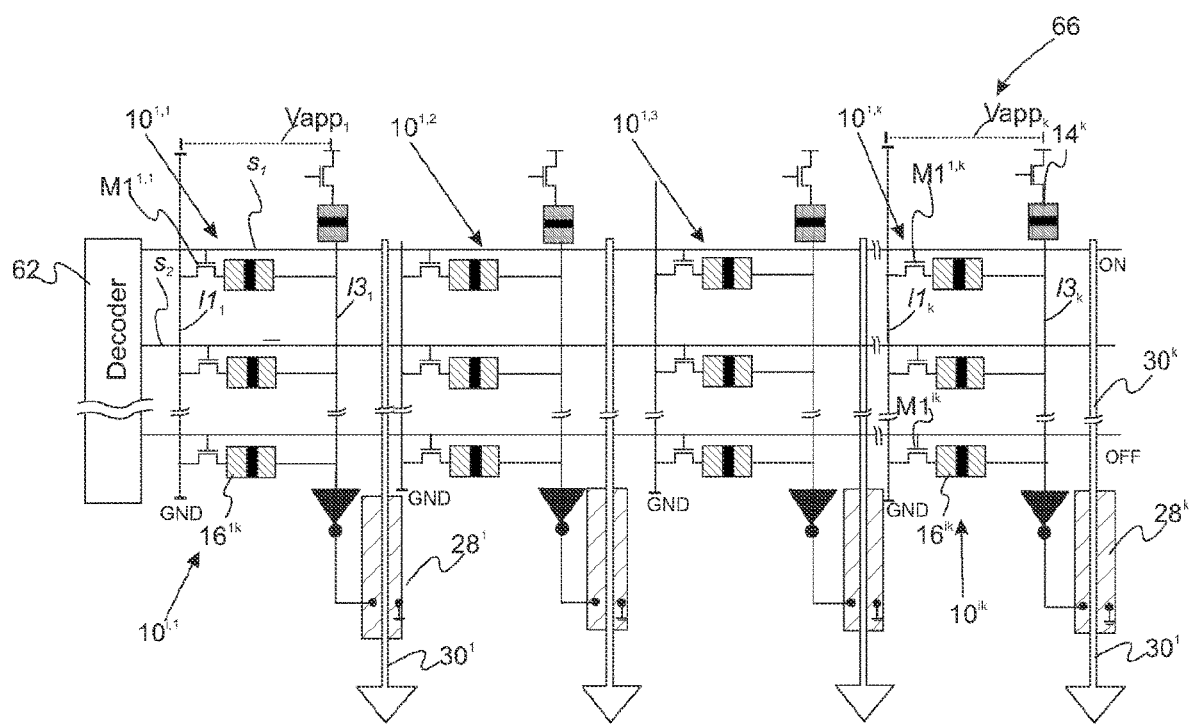

With reference to FIGS. 4A, 4B, 5A, and 5B, schematics of memory arrays in which columns of memory cells share a common reference resistive component are provided. FIGS. 4A and 4B depict memory arrays in which columns of memory cells share a common reference resistive component $14^k$ and in which the optical modulator is an electro-absorption modulator. FIGS. 5A and 5B depict memory arrays in which columns of memory cells share a common reference resistive component $14^k$ and in which the optical modulator is an optical ring modulator. Memory array 66 includes a plurality of memory cell components $10^{i,k}$ are arranged with rows of memory cells and columns of memory cells where i is a label for the rows and k is a label for the columns. Each column of memory cells includes a reference magnetic tunnel junction $14^k$ and a plurality of memory cell components $10^{i,k}$. Each memory cell component $10^{i,k}$ includes a switchable magnetic tunnel junction $16^{i,k}$ in series with the transistor switch and the reference magnetic tunnel junction. Switching component $24^{i,k}$ is configured to activate a corresponding memory cell component. When switching component $24^{i,k}$ is electrically activated control signal is an electronic signal provided on electronic interconnects. When switching component $24^{i,k}$ is light-activated control signal is a light signal $s_i$ typically provided by optical interconnects (e.g., waveguides). Switching component $24^{i,k}$ of each row of memory cell components is in electrical or optical communication with the same control signal $s_i$. Characteristically, for read operations the read voltage Vapp can be the same for all columns. For write operations, the write voltage depends on the data to be written. In a refinement, the write voltage can be applied between lines $11_i$, and $12_i$. FIGS. 4B and 5B depicts examples in which switching component 24 is an electronically actuated transistor $M1^{i,j}$.

Therefore, a given row of memory cells is actuated (i.e., selected) by control signal $s_i$. The transistor switch is connected to the voltage controlled magnetic tunnel junction in series with the voltage controlled magnetic tunnel junction. Characteristically, there is an applied voltage between applied across the single reference magnetic tunnel junction and the transistor switch during read operations. Each column of memory cell components $10^{ik}$ also includes a light modulator $28^{ik}$ in electrical communication with the output voltage. The light modulator $28^{ik}$ is configured to modulate guided light beam $30^i$. Characteristically, each combination reference resistive component $14_k$ and memory cell components $10^{i,k}$ in each column of column of memory has the same applied voltage $Vapp_k$. Therefore, a given row of memory cells is actuated (i.e., selected) by control signal $s_i$. In a refinement, memory array 66 further includes a decoder 62 that allow selection of the rows of memory cells. Advantageously, the sharing of light modulators in the design of FIGS. 4A, 4B, 5A, and 5B allow an area reduction for a fabricated memory device. In the variation of FIGS. 4A and 4B, the optical modulator 28 is an optical ring modulator. In the variation of FIGS. 5A and 5B, the optical modulator 28 is an electro-absorption modulator. Read/write operations are as described above. In a refinement, the write voltage Vwrite can be applied between lines $Il_i$ and $Il_i$. The value and polarity of the write voltage Vwrite will depend of the value of the memory bit to be written (i.e., 1 or 0 valued bit).

Advantageously, by using input lights of different wavelengths combined with wavelength division multiplexing (WDM), multiple columns of the memory arrays set forth In FIGS. 2 and 3 can be read in a single cycle, increasing the overall memory bandwidth. Thus, a high-speed, high bandwidth optically read/write non-volatile memory (NVM) could be implemented using the presented proposal. In a variation, a memory structure includes multiple array sections formed by the memory array of FIGS. 4A and/or 4B and/or 5A and/or 5B.

Figure 6A:
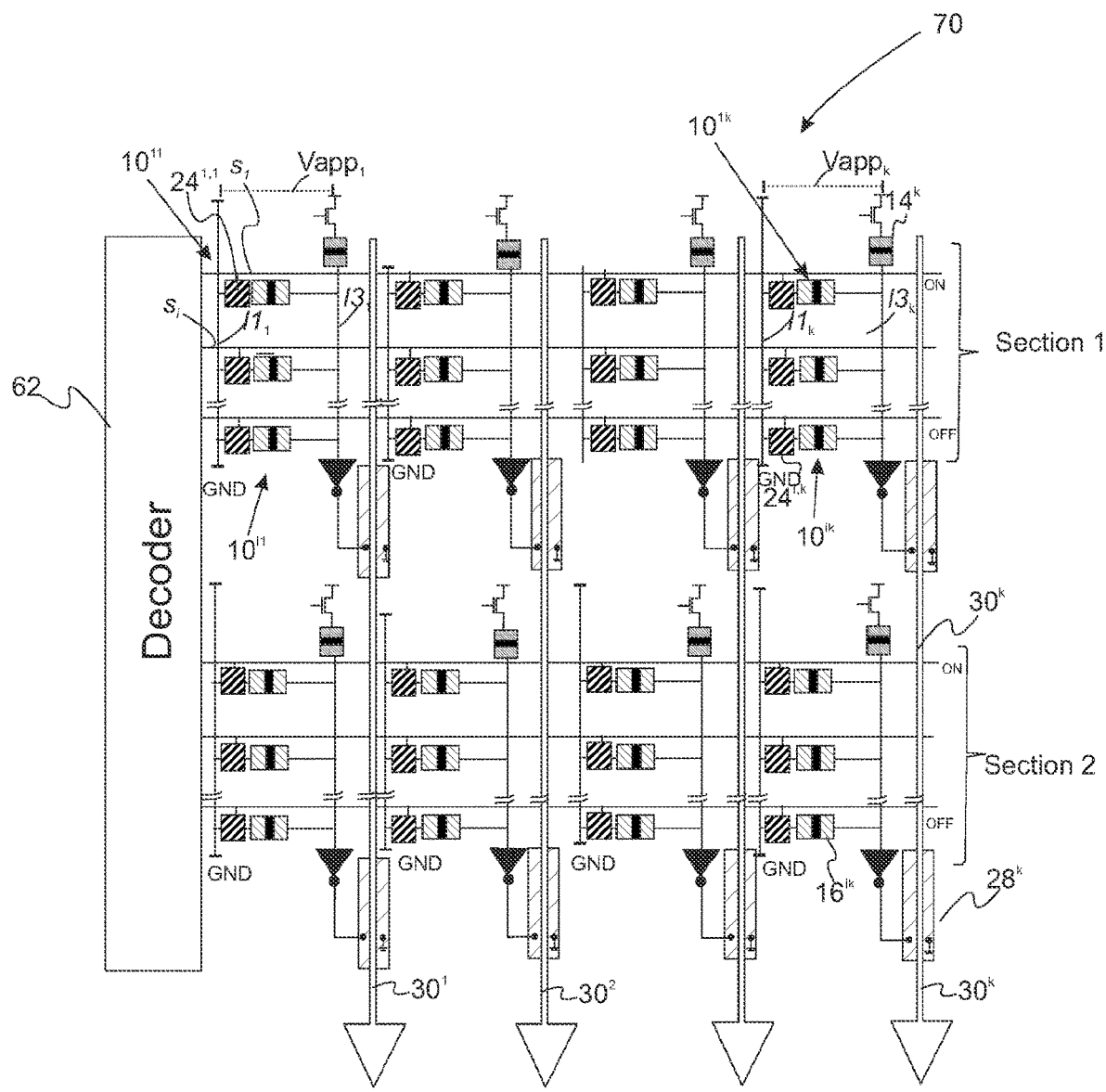
FIGS. 6A and 6B. Schematic of an MTJ memory architecture having multiple memory arrays such as the arrays of FIGS. 2A, 2B, 3A, and 3B.
Figure 6B:
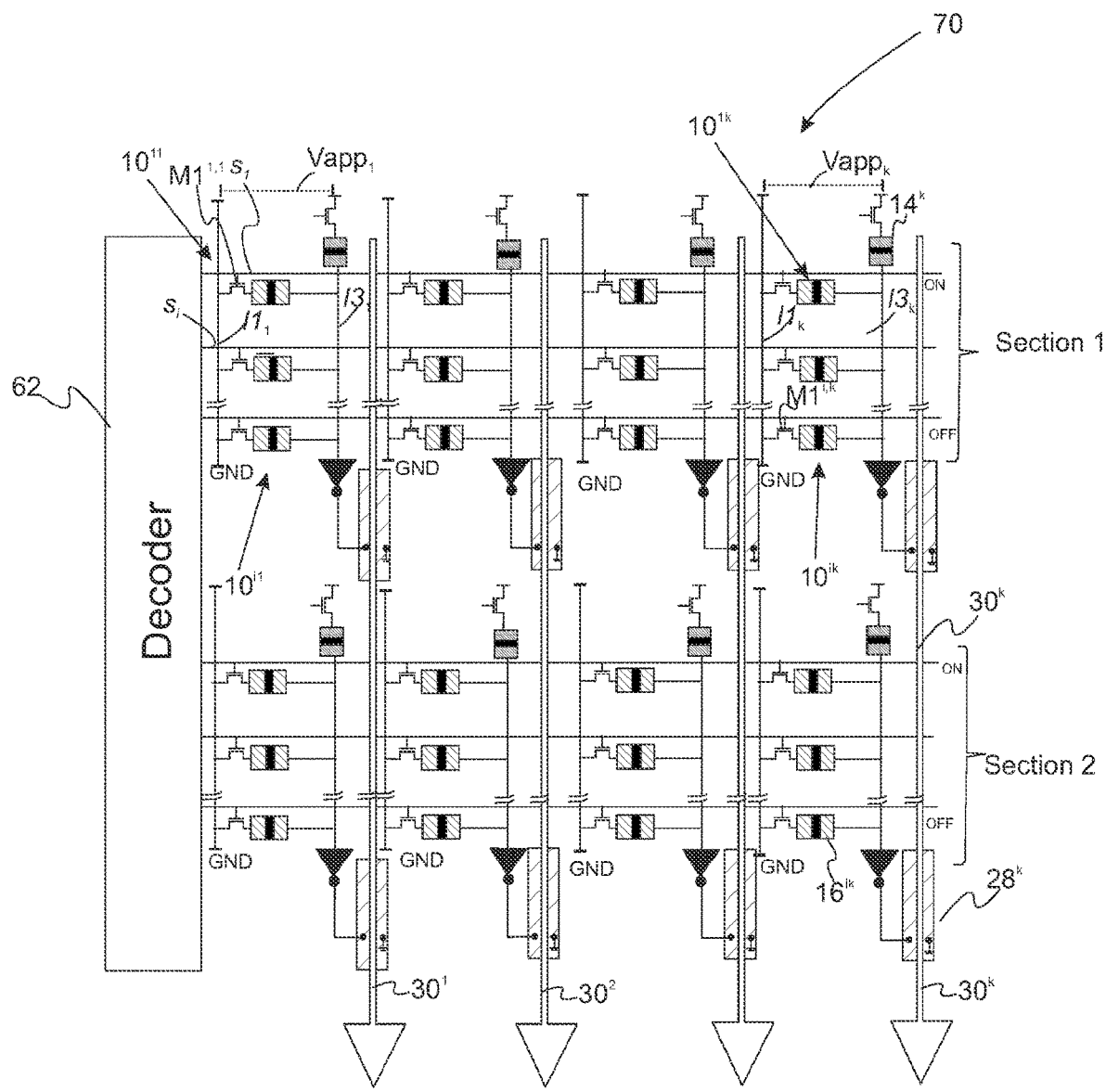

FIGS. 6A and 6B depicts a memory architecture 70 that includes multiple section of memory arrays as depicted in FIGS. 2-5. In this variation, sections of memory arrays are arranged in series with optical interconnects directing light beam $30^i$ through each light modulator in a row of memory cell components. In a variation, a memory structure includes multiple array sections formed by the memory array of FIGS. 6A and/or 6B. Details for memory cells $10^{i,k}$, switching components $24^{i,k}$, transistor switch $M1^{i,j}$, optical modulators $30^k$, Vapp, decoder 62, and the other components illustrated are described above.

Figure 7:
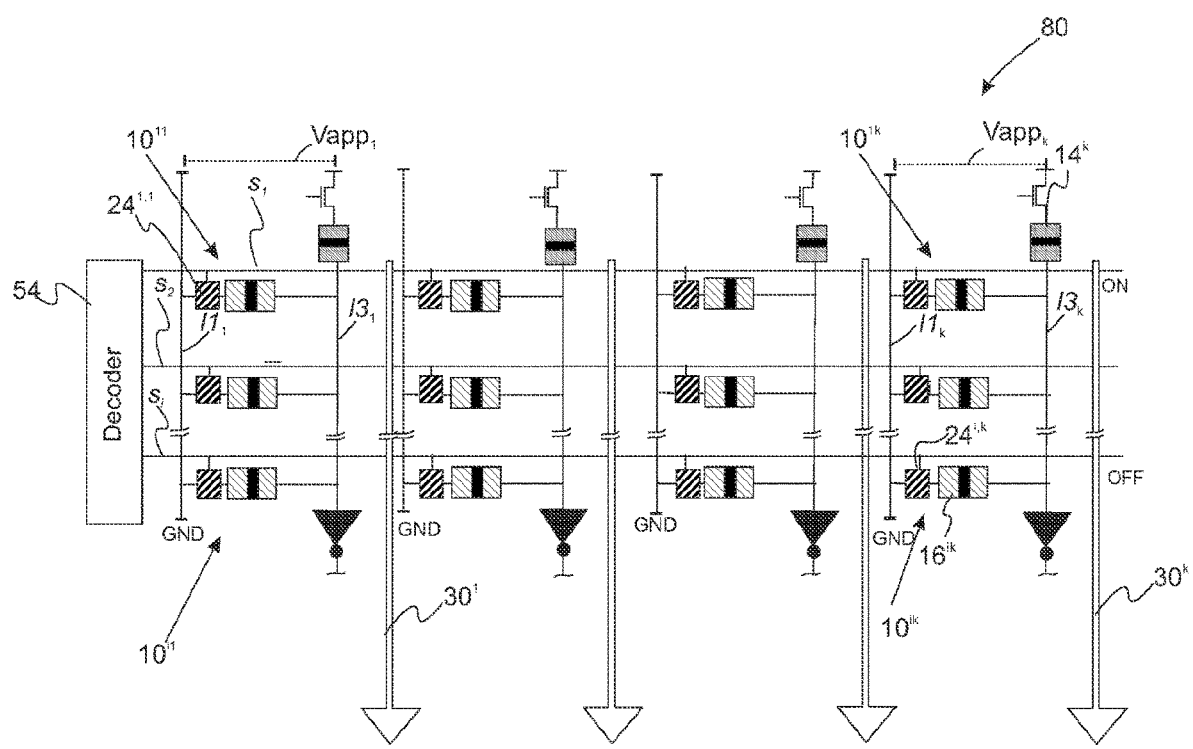
FIG. 7. Schematic of illustrating the application of the MTJ memory architecture for on-chip computing.

FIG. 7 illustrates the application of the memory arrays of FIGS. 2 to 6 to in-memory computing. As an example, this figure shows the array of FIGS. 4A, 4B, 5A, and 5B. Advantageously, the memory architecture provides at least three levels of parallelism. In the first level of array 80, multiple rows of memory cells are simultaneously activated. The currents from the simultaneously memory cells in a given column are combined together to provide a combined output voltage. In another level, the modulated light from one array section further modulated with the light modulator in another array section resulting in a somewhat complicated modulated light beam. Finally, light beams of different wavelengths can be applied to optical interconnect in different column of memory cells for wavelength division multiplexing (WDM). After the light beams of different wavelengths are modulated, they can be combined together to perform an in-memory operation. Details for memory cells $10^{i,k}$, switching components $24^{i,k}$, transistor switch $M1^{i,j}$, optical modulators $30^k$, Vapp, decoder 62, and the other components illustrated are described above.

Figure 8:
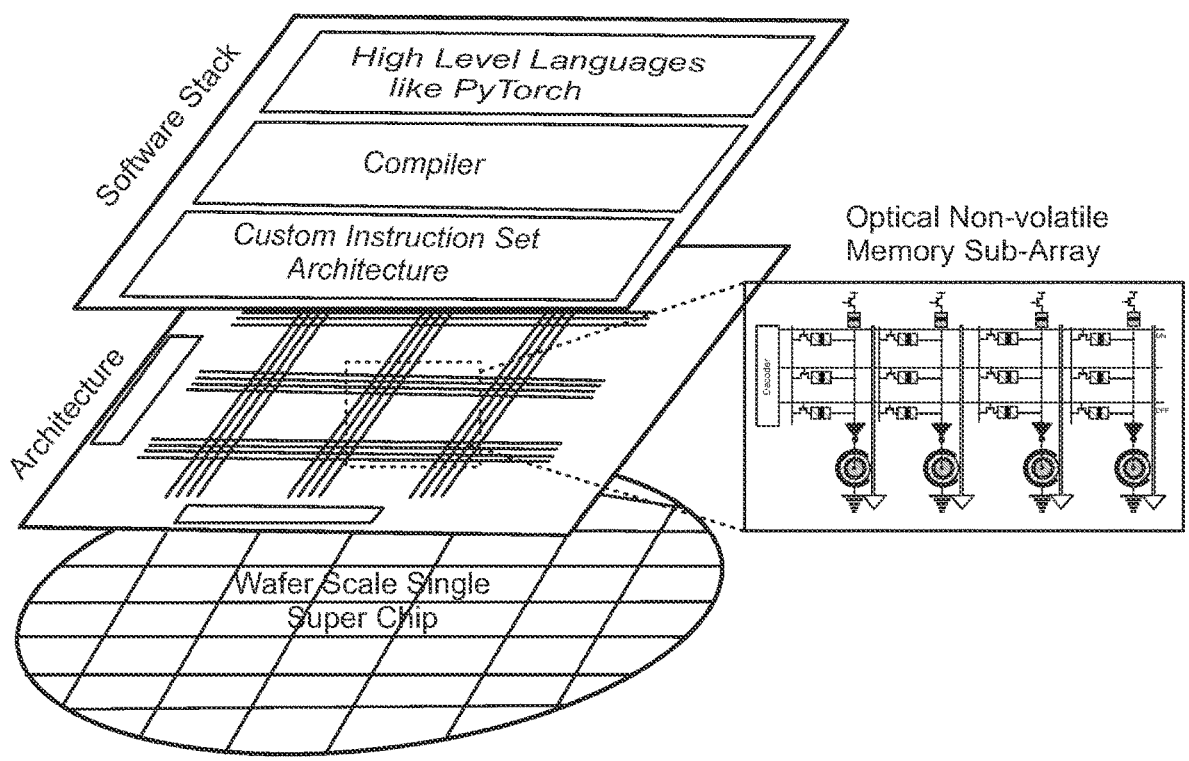
FIG. 8. Schematic of a wafer scale single chip with non-volatile memory architecture and optical read/write capability.

FIG. 8 depicts a wafer scale memory integration using the memory cells and structures of FIGS. 1 to 5. Wafer scale integration is the idea of fabricating a super chip on a whole 8 inch or 12-inch wafer. In this variation, the memory cells and array along with the interconnects are deposited or printed on a wafer. The memory array and/or the memory array sections can be large (e.g., ¼ of the wafer or more) because of the high speed provided by the optical interconnects. Advantageously, optical interconnects connect one end of the wafer to another end of the wafer. In a refinement, the optical interconnects are used for long reach of greater than about 4 mm from the memory cells. In a further refinement, electrical interconnects are used for short reach from the memory cells of less than or equal to 4 mm. As set forth above, the optical interconnects includes optical waveguides, optical couplers, filters, polarizers, optical waveguide bends, optical waveguide tapers, beam splitters, beam combiners, and other optical components.

Application Examples: Analog Computing and Neuromorphic Computing

While the wafer-scale memory architecture can be used for digital computing, it can also be exploited for added computational speed and efficiency using analog computing. Analog computing can be achieved by one or combination of following methods 1) multiple MTJs in an array can be activated for read operation thereby providing an analog convolution operation similar to memristive dot products 2) multiple RMs or EAMs can be read simultaneously, thus achieving optical convolution operations 3) WDM can be used to enable more parallelism in addition to 1) and 2). Further, for neural computations, the optical convolution read output can be connected to existing proposals for optical spiking as well as non-spiking analog neurons.

Interestingly, a significance driven hybrid fine-grained digital+analog optimization for AI and neuromorphic computing can be enabled for the presented proposal. Since the presented proposal can support classical digital computing and analog computing, more significant (error-sensitive) layers of a neural network can be accelerated by full digital computing. In contrast, less significant (error-resilient) layers could be accelerated through analog computing. The transition for digital to analog computing or vice-versa could be during run-time and software programmable.

In conclusion, the memory design set forth above have the potential to produce the largest and fastest memory system featuring (1) wafer scale single super non-volatile magnetic memory chip with (2) optical read and write capability (3) optical interconnects for long distance within wafer communication (4) digital and analog computing.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. An ultrafast non-volatile memory cell for wafer-scale integration comprising:
   a voltage divider that outputs an output voltage, the voltage divider comprising:
      a reference resistive device that is a reference magnetic tunnel junction or another reference resistive component; and
      a switchable magnetic tunnel junction including a free magnet and a fixed magnet, the reference resistive device and the switchable magnetic tunnel junction arranged in series, the switchable magnetic tunnel junction configured such that the free magnet is light switchable between a high impedance state and a low impedance state upon application of an electric signal and incident light;
   a switching component configured to activate the voltage divider for memory read and write operations, the switching component being in series with the voltage divider; and
   a light modulator in electrical communication with the output voltage, the light modulator configured to modulate a guided light beam for memory read operations.

2. The memory cell of claim 1 wherein switching component includes an electronically activated transistor.

3. The memory cell of claim 1 wherein switching component includes a photodiode or phototransistor.

4. The memory cell of claim 1 wherein write operations are performed by applying an appropriate write voltage across the combination of the switchable magnetic tunnel junction and the switching component and then directing incident light on the switchable magnetic tunnel junction such that neighboring magnetic tunnel junctions do not have appropriate applied voltage across thereon and therefore do not switch.

5. The memory cell of claim 4 wherein read operations are performed by applying a read voltage across the combination of the voltage divider and the switching component such that the voltage divider provides the output voltage, the read voltage resulting in a high voltage or low voltage depending on the state of the combination of the reference resistive device and the switchable magnetic tunnel junction, the output voltage driving the light modulator.

6. The memory cell of claim 5 wherein the read voltage can have a lower, equal, higher or even of different polarity as compared to a write voltage.

7. The memory cell of claim 1 wherein the switchable magnetic tunnel junction is selected from the group consisting of a voltage controlled magnetic tunnel junction, a spin transfer torque device, and combinations thereof.

8. The memory cell of claim 1 wherein the electric signal is a voltage or current signal.

9. The memory cell of claim 1 wherein the switchable magnetic tunnel junction is a voltage controlled magnetic tunnel junction.

10. The memory cell of claim 9 wherein there is an applied voltage applied across the combination of the voltage divider and the switching component.

11. The memory cell of claim 1 wherein the light modulator changes phase, amplitude, or another property of the guided light beam in voltage dependent way that can be detected.

12. The memory cell of claim 1 wherein the light modulator is an optical ring modulator.

13. The memory cell of claim 1 wherein the light modulator is an absorption modulator.

14. The memory cell of claim 1 wherein the light modulator is a Mach-Zehnder modulator.

15. The memory cell of claim 1 wherein a signal modifying circuit is interposed between the output voltage and the light modulator.

16. The memory cell of claim 15 wherein the signal modifying circuit is an inverter.

17. The memory cell of claim 15 wherein the signal modifying circuit is an amplifier.

18. The memory cell of claim 1 wherein the guided light beam is provided to the light modulator by an optical interconnect.

19. A memory cell array including a plurality of memory cells of claim 1.

20. A memory array including a plurality of memory cells arranged with rows of memory cells and columns of memory cells, each memory cell including:
   a voltage divider that outputs an output voltage, the voltage divider comprising:
      a reference resistive device that is a reference magnetic tunnel junction or another reference resistive component; and
      a switchable magnetic tunnel junction including a free magnet and a fixed magnet, the reference resistive device and the switchable magnetic tunnel junction arranged in series, the switchable magnetic tunnel junction configured such that the free magnet is light switchable between a high impedance state and a low impedance state upon application of an electric signal and incident light;
   a switching component configured to activate the voltage divider for memory write operations, the switching component in series with the voltage divider, wherein there is an applied voltage applied across the combination of the voltage divider and the switching component; and
   a light modulator in electrical communication with the output voltage, the light modulator configured to modulate a guided light beam for memory write operations.

21. The memory array of claim 20 wherein the switching component includes an electronically activated transistor.

22. The memory array of claim 20 wherein switching component includes a photodiode or phototransistor.

23. The memory array of claim 20, wherein light of different wavelengths is applied to optical interconnects passing through different columns of memory cells or memory cell components.

24. A memory structure including multiple array sections formed by the memory array of claim 20.

25. A method of in-memory computing using the memory array of claim 20, the method comprising simultaneously activating rows of memory cells or memory components.

26. A wafer having wafer scale memory integration of the memory array of claim 25, wherein memory arrays and/or memory structures and/or optical interconnects are printed or deposited on the wafer.

27. The wafer of claim 26 wherein optical interconnects connect one end of the wafer to another end of the wafer.

28. The wafer of claim 27 wherein the optical interconnects include optical waveguides, optical couplers, filters, polarizers, optical waveguide bends, optical waveguide tapers, beam splitters, beam combiners, and other optical components.

29. The wafer of claim 27 wherein the optical interconnects are used for long reach of greater than about 4 mm from memory cells.

30. The wafer of claim 27 wherein electrical interconnects are used for short reach from memory cells of less than or equal to 4 mm.

31. A memory array comprising:
an array of memory components arranged in rows of memory cells and columns of memory cells, each column including:
a reference resistive device; and
a plurality of memory cell components, each memory cell component including:
a switchable magnetic tunnel junction including a free magnet and a fixed magnet, the reference resistive device and the switchable magnetic tunnel junction arranged in series, the switchable magnetic tunnel junction configured such that the free magnet is light switchable between a high impedance state and a low impedance state upon application of an electric signal and incident light, wherein the reference resistive device and a selected switchable magnetic tunnel junction form a voltage divider that provides an output voltage;
a switching component configured to activate the voltage divider for memory read and write operations, the switching component in series with the voltage divider; and
a light modulator in electrical communication with the output voltage, the light modulator configured to modulate guided light for memory read operations,
wherein each switching component of each row of memory cell components is in electrical communication with the same control signal so that a row of memory cell components can be simultaneously selected.

32. The memory array of claim 31, wherein the switching component includes an electronically activated transistor.

33. The memory array of claim 31, wherein switching component includes a photodiode or phototransistor.

34. The memory array of claim 31, wherein light of different wavelengths is applied to optical interconnects passing through different columns of memory cells or memory cell components.

35. A memory structure including multiple array sections formed by the memory array of claim 31.

36. A method of in-memory computing that applies the memory array claim 31, the method comprising simultaneously activating rows of memory cells or memory components.

37. The method of in-memory computing of claim 36 further comprising combining currents from cells in a given column that are simultaneously activated.

38. The method of in-memory computing of claim 36 further comprising combining modulated light beam from cells in a given column that are simultaneously activated.

39. The method of in-memory computing of claim 36 further comprising apply light of different wavelengths to optical interconnects in different columns of memory cells or memory cell components.

40. An array comprising a plurality of memory cells, each memory cell having a design of claim 39.

41. The array of claim 40 wherein each column of memory cells share a common reference resistive device with the voltage divider.

42. An ultrafast non-volatile memory cell for wafer-scale integration comprising:
a voltage divider that outputs an output voltage, the voltage divider comprising:
a reference resistive device that is a reference magnetic tunnel junction or another reference resistive component; and
a switchable SOT device including a free magnet and a fixed magnet which are disposed over an SOT layer, the SOT layer having a first SOT terminal and a second SOT terminal, the reference resistive device and the switchable SOT device arranged in series, the switchable SOT device is configured such that the free magnet is light switchable between a high impedance state and a low impedance state upon application of an electric signal and incident light;
a first transistor switch in electrical communication with the first SOT terminal, the first transistor switch having a first junction end and a second junction end, the second junction end being in direct electrical communication with the first SOT terminal;
a second transistor switch in electrical communication with the reference resistive device, the second transistor switch having a third junction end and a fourth junction end, the third junction end being in direct electrical communication with the reference resistive device that; and
a light modulator in electrical communication with the output voltage, the light modulator configured to modulate a guided light beam for memory write operations.

43. The memory cell of claim 42 wherein during write operation the first transistor switch is ON such that a current flows between a first transistor junction end TJ1 and a second SOT terminal ST2, a direction of current flow depending on data to be written, when light shines, a current through SOT layer between first transistor junction end TJ1 and the second SOT terminal ST2 switches the free magnet, all this while during the write operation, the second transistor switch is OFF.

44. The memory cell of claim 42 wherein during read operations, the second transistor switch is ON while the first transistor switch is OFF thereby forming the fourth junction end and the second SOT terminal such that the light modulator in electrical communication with the output voltage modulates the guided light beam.

* * * * *